(12) United States Patent
Yu et al.

(10) Patent No.: US 11,336,554 B2
(45) Date of Patent: May 17, 2022

(54) UNIVERSAL SEMICONDUCTOR-BASED AUTOMATIC HIGHSPEED SERIAL SIGNAL TESTING METHOD

(71) Applicant: SINO IC TECHNOLOGY CO., LTD., Shanghai (CN)

(72) Inventors: Kun Yu, Shanghai (CN); Zhiyong Zhang, Shanghai (CN); Hua Wang, Shanghai (CN); Jianhua Qi, Shanghai (CN); Bin Luo, Shanghai (CN)

(73) Assignee: SINO IC TECHNOLOGY CO., LTD., Shanghai (CN)

( * ) Notice: Subject to any disclaimer, the term of this patent is extended or adjusted under 35 U.S.C. 154(b) by 278 days.

(21) Appl. No.: 16/759,351

(22) PCT Filed: Jun. 8, 2018

(86) PCT No.: PCT/CN2018/090420
§ 371 (c)(1),
(2) Date: Apr. 26, 2020

(87) PCT Pub. No.: WO2019/223028
PCT Pub. Date: Nov. 28, 2019

(65) Prior Publication Data
US 2020/0313998 A1 Oct. 1, 2020

(30) Foreign Application Priority Data
May 25, 2018 (CN) .......................... 201810518931.9

(51) Int. Cl.
*H04L 12/26* (2006.01)
*H04L 43/50* (2022.01)
(Continued)

(52) U.S. Cl.
CPC ........ *H04L 43/50* (2013.01); *G01R 31/31905* (2013.01); *H03F 1/56* (2013.01);
(Continued)

(58) Field of Classification Search
CPC ................ G01R 31/26; G01R 31/2642; G01R 31/2648; G01R 31/2831; G01R 31/31702;
(Continued)

(56) References Cited

U.S. PATENT DOCUMENTS

| | | | | |
|---|---|---|---|---|
| 2017/0315173 A1* | 11/2017 | Jaklitsch | ................ | G01R 15/12 |
| 2019/0072594 A1* | 3/2019 | Leibfritz | ................ | G01R 23/02 |
| 2019/0108979 A1* | 4/2019 | Higuchi | ............ | H01L 21/67069 |

* cited by examiner

*Primary Examiner* — Tung X Nguyen
(74) *Attorney, Agent, or Firm* — IPro, PLLC

(57) ABSTRACT

The invention relates to a universal semiconductor automatic high-speed serial signal testing method, comprising: a chip to be tested sending, to an impedance matching unit, a high-speed serial signal; then by means of a phase shift unit, sequentially transforming, according to a set fixed resolution, the phase of the high-speed serial signal, the magnitude of each offset phase being determined by a phase shift control signal outputted by a control unit and the resolution of the phase shift unit; after passing through the phase shift unit, the high-speed serial signal keeps channel impedance matching by means of the impedance matching unit; the signal entering an acquisition unit, and being acquired under the action of an acquisition control signal sent by the control unit; the control unit performing signal exchange with semiconductor automatic testing equipment (ATE); and the acquisition unit transmitting the acquired signal back to the universal semiconductor ATE for algorithm operation, and then the actual high-speed serial data stream is obtained. The present invention enables direct testing of high-speed serial interface signals by means of the universal ATE during mass production, greatly improving testing convenience and efficiency.

3 Claims, 2 Drawing Sheets

(51) Int. Cl.
*H03F 1/56* (2006.01)
*H03H 7/40* (2006.01)
*H04L 43/08* (2022.01)
*G01R 31/319* (2006.01)
*H03H 7/38* (2006.01)

(52) U.S. Cl.
CPC ............... *H03H 7/40* (2013.01); *H04L 43/08* (2013.01); *H03H 2007/386* (2013.01)

(58) Field of Classification Search
CPC ........... H04B 3/46; H04B 17/00; H04L 43/00; H04L 43/50; H04W 24/00
See application file for complete search history.

UNIVERSAL SEMICONDUCTOR-BASED AUTOMATIC HIGHSPEED SERIAL SIGNAL TESTING METHOD

TECHNICAL FIELD

The disclosure herein relates to the field of a testing method, in particular relates to a universal semiconductor automatic high-speed serial signal testing method.

BACKGROUND

For semiconductor integrated circuits, to achieve a transmission rate of Gbps, if a parallel bus is used, the clock frequency must reach GHz, and the system clock frequency is very high. The parallel interface is often arranged with a length of dozens of wires which is difficult, and the crosstalk of the signal cannot be completely overcome, the bottleneck of the parallel bus becomes very prominent. Serial signals refer to data transmitted on a data signal line bit by bit. High-speed serial signals usually refer to serial signals with a transmission rate of Gbps and above.

The verification and testing of high-speed serial systems and traditional signal testing have their own special features. Traditional signal testing is concerned with the analog characteristics of the signal, including the inspection of timing and amplitude characteristics. For parallel buses, the timing measurement is mainly based on the setup/hold time. In order to meet the receiver's ability to latch data correctly, the timing of the data and clock must meet the setup/hold time requirements, otherwise bit error will be occurred. For high-speed serial systems, the purpose of testing is also to verify that the system meets the design's requirements of bit error rate. The difference between parallel and serial lies in the difference of data latch processing and clock transmission between transmitting end and receiving end. The serial system sends data to the bus at the transmitting end through the serial transmitter at the sending clock, the clock must be recovered from the data and decoded at the receiving end. In serial systems, we no longer care about the timing between the clock and data signals, but whether we can send data strictly at a certain time at the transmitting end and whether data can be recovered through the collection of test equipment at the receiving end. The universal sampling rate of universal ATE is in the order of hundreds of Mbps. According to the requirements of the sampling theorem, it is very difficult to directly collect high-speed serial signals of Gbps rate and above.

If the rate of the high-speed serial signal under test is greater than the sampling rate supported by the universal ATE, the universal ATE cannot directly perform the acquisition test for the high-speed serial signal. In the existing laboratory verification tests, test equipment that supports higher sampling rates, such as high-speed oscilloscopes, is used to test them. The equipment is expensive, the test time is long, and the results need to be read manually, the degree of automation is not high.

SUMMARY

The present invention aims at the problem that it is difficult to do high-speed serial testing by using universal ATE because the high-speed serial signal rate is greater than the sampling rate supported by universal ATE. The present invention proposes a universal semiconductor high-speed serial signal automatic test method, which is suitable for universal semiconductor ATE and solves the problem that such testing always rely on expensive test equipment like an higher sampling rates oscilloscope, low test efficiency and low degree of automation.

The technical solution of the present invention is: a universal semiconductor automatic high-speed serial signal testing method, which is characterized in that comprising: acquiring a high-speed serial signal outputted by a chip to be tested, a control unit outputting a control signal to the chip to be tested, the chip to be tested firstly sending, the high-speed serial signal to an impedance matching unit, passing the high-speed serial signal into a phase shift unit through impedance matching, then by means of the phase shift unit, sequentially transforming, according to a set fixed resolution, the phase of the high-speed serial signal, the magnitude of each offset phase being determined by a phase shift control signal outputted by the control unit and the resolution of the phase shift unit; after passing through the phase shift unit, the high-speed serial signal keeps channel impedance matching by means of the impedance matching unit; the signal entering an acquisition unit, and being acquired under the action of an acquisition control signal sent by the control unit; the control unit performing signal exchange with semiconductor ATE; and the acquisition unit transmitting the acquired signal back to the universal semiconductor ATE for algorithm operation, and then the actual high-speed serial data stream is obtained.

The phase shift unit is composed of n+1 phasers and corresponding n+1 control bits, the phase shift of the n+1 phasers are $\theta*2^i$, i=0, 1, 2, 3, . . . n, $\theta*2^n=180°$, the phase shift control signal outputted by the control unit is applied to each control bit, make each control bit control the relay switch to different positions respectively, make the n+1 phasers enter phase shift in different combinations, each high-speed serial signal passing into a phase shift unit through impedance matching, the signal outputted by the phase shift unit is phase shifted relative to the inputted high-speed serial signal.

The acquisition unit receiving the high-speed serial signal with different phase shift, the acquisition unit acquiring at the acquisition rate of the acquisition unit after each phase shift, which is equivalent to sampling high-speed serial signals at a fixed number of different sampling points.

The beneficial effects of the present invention are: the universal semiconductor automatic high-speed serial signal testing method of the present invention realizes the mass production testing of the high-speed serial interface signal by using universal ATE directly, which greatly improves the test convenience and test efficiency.

DETAILED DESCRIPTION

Figure 1:
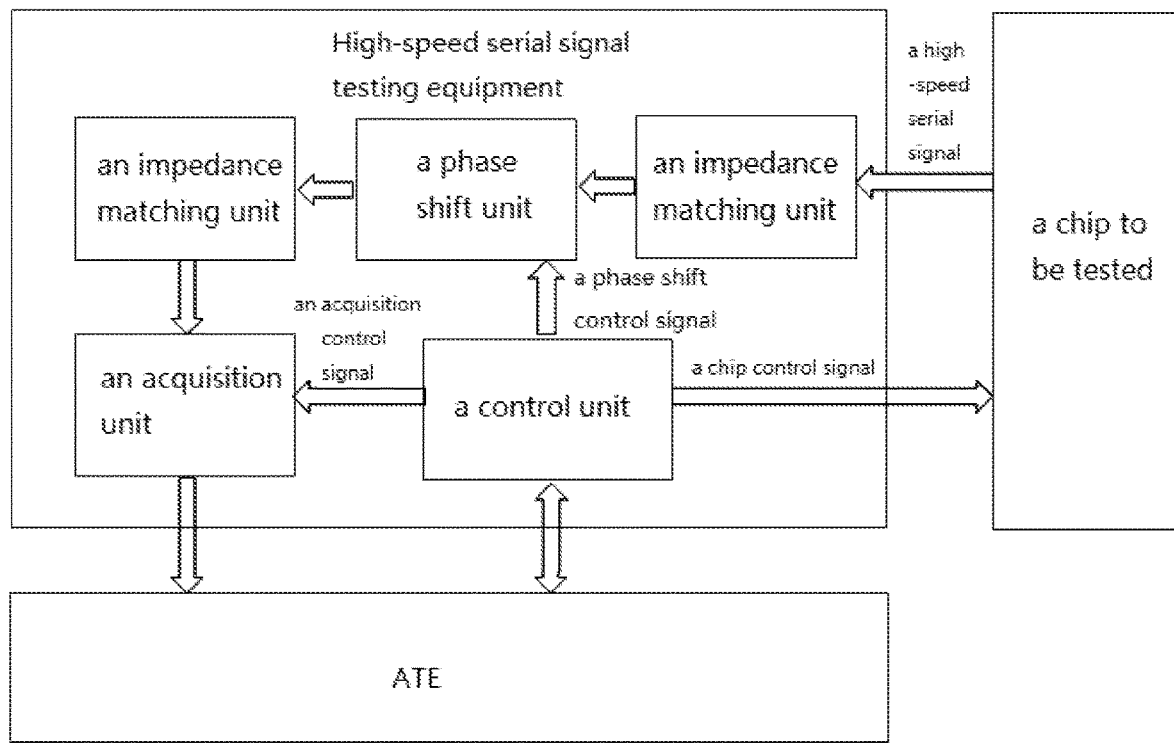
FIG. 1 is a functional block diagram of a high-speed serial signal test equipment of the present invention.

This technical solution realizes the universal ATE direct acquiring and testing of high-speed serial signals. When the chip to be tested outputs a high-speed serial signal with a transmission rate of Ft (~Gbps), the sampling rate provided by the universal ATE is only Fs (~100 Mbps), and Fs is far less than Ft. At this moment, the high-speed serial signal can be acquired and tested by the high-speed serial signal test equipment based on universal ATE. The test equipment mainly includes an impedance matching unit, a phase shift unit, a control unit, and an acquisition unit. The functional block diagram is shown in FIG. 1.

The high-speed serial signal outputted by the chip needs to be acquired and tested. The signal can be passed through the impedance matching unit to perform impedance matching control of the entire signal path, and then the phase of the high-speed serial signal can be sequentially converted according to a fixed resolution by the phase shift unit, such as 0°, 5.625°, 5.625°*2, 5.625°*3, . . . , 5.625°*16 (90°), . . . 5.625°*32 (180°), . . . 5.625°*63 (354.375°), 5.625°*64 (360°). The magnitude of each offset phase being determined by a phase shift control signal outputted by the control unit and the resolution of the phase shift unit; after passing through the phase shift unit, the high-speed serial signal keeps channel impedance matching by means of the impedance matching unit; the signal entering an acquisition unit, and being acquired under the action of an acquisition control signal sent by the control unit; the control unit performing signal exchange with semiconductor ATE; and the acquisition unit transmitting the acquired signal back to the universal semiconductor ATE for algorithm operation, and then the actual high-speed serial data stream is obtained. Wherein, the control unit interacts with the ATE signal, outputs an acquisition control signal to the acquisition unit and outputs a chip control signal to the chip to be tested.

Figure 2:
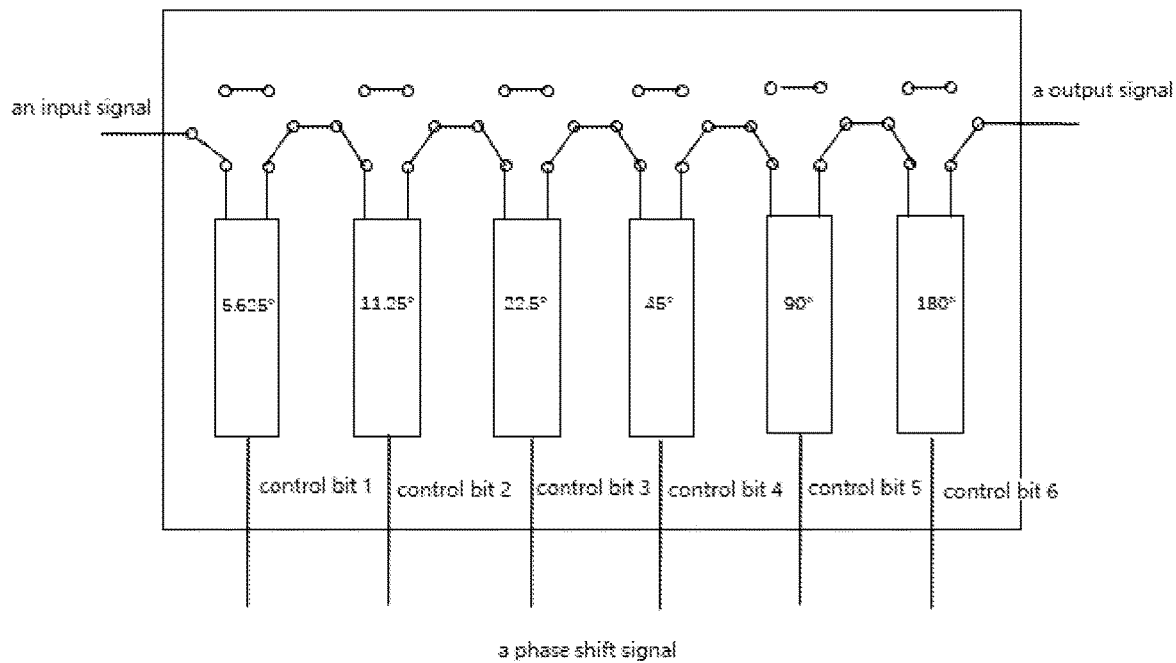
FIG. 2 is a schematic diagram of a working mode of a phase shift unit of the present invention.

Specifically, the working mode of the phase shift unit is shown in FIG. 2, the phase shift unit consists of 6 phasers and corresponding 6 control bits, the phase shifts of the 6 phasers are $5.625°*2^i$ (i=0, 1, 2, 3, 4, 5), $5.625°*2^5=180°$. The phase shift control signal is applied to each control bit, so that different control bits have 0 and 1 states, respectively. The relay switch is controlled to different positions to make the output signal phase shift relative to the input signal. If the phase shift is 0°, the control bits 1-6 are set to 000000, and the input signal directly passes through the conducting line in the upper of FIG. 2 to the output without generating a phase shift. If the offset is 5.625°, the control bits 1-6 are set to 100000, and the input signal passes through the conducting straight line to the output only after 5.625° phase shift. In this way, the phase shift of 5.625° multiple of each signal can be completed through the control bits 1-6. Phase shift of 0° (000000), 5.625° (100000), 5.625°*2 (11.25°; 010000), 5.625°*3 (110000), . . . , 5.625°*16 (90° 000010), . . . 5.625°*32 (180°; 000001), . . . 5.625°*63 (354.375°; 111111). The control unit controls the chip to be tested to repeatedly send out the high-speed serial signal under test, and at the same time controls the corresponding phase offset through the control bit to obtain the signal of the tested high-speed serial signal under different phase offsets. The measured signal is sent to ATE, the final high-speed serial signal can be obtained after analysis by ATE. Therefore, the technical solution of this invention can be realized that Gbps high-speed serial signal can be tested by using universal ATE which sampling rate is ~Mbps for mass production.

Figure 3:
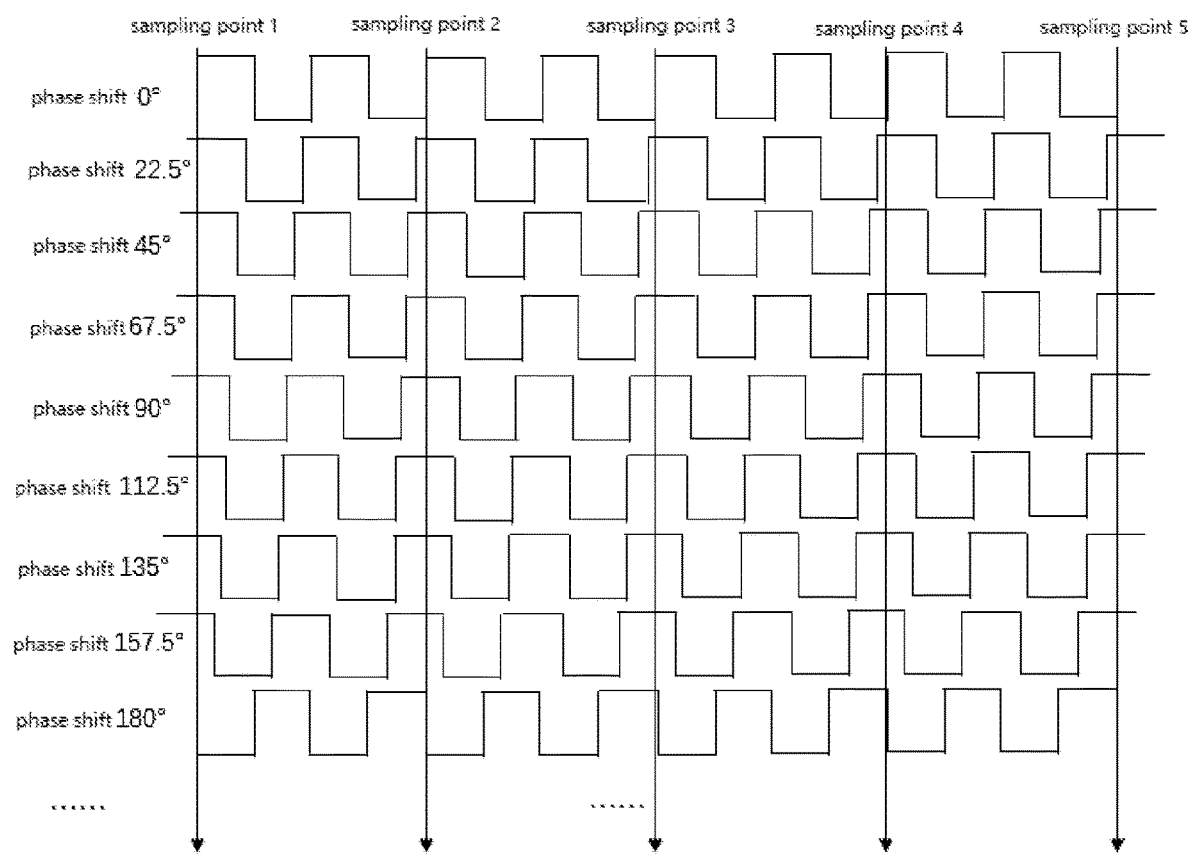
FIG. 3 is a schematic diagram of high-speed serial signal acquisition of the present invention.

FIG. 3 is a schematic diagram of high-speed serial signal acquisition of the present invention. The actual acquired high-speed serial signal transmission rate is 1 Gbps, the sampling rate provided by the universal ATE is 250 Mbps, and the signal rate is 4 times the sampling rate. Therefore, the phase shift unit shown in FIG. 2 is controlled by different control bit codes to achieve a phase shift of 22.5° each time. For example, write 01000 to control bit 1-6 to achieve a phase shift of 22.5°, and so on, phase shift 45° (control bit code 000100), 67.5° (control bit code 001100), 90° (control bit code 000010), 112.5° (control bit code 001010), 135° (control bit code 000110), 157.5° (control bit code 001110), 180° (control bit code 000001) . . . 337.5° (control bit code 001111), 360° (control bit code 000000). Each time the high-speed serial signal changes the phase, the acquisition unit collects the high-speed serial signal according to the acquisition rate of the acquisition unit, which is equivalent to sampling the high-speed serial signals at fixed five different sampling points as shown in FIG. 3. Record the data of each sample "11111 (phase shift 0°), 11111 (phase shift 22.5°), 11111 (phase shift 45°), 11111 (phase shift 67.5°), 11111 (phase shift 90°), 11111 (phase shift 112.5°), 11111 (phase shift 135°), 11111 (phase shift 157.5°), 00000 (phase shift 180°) . . . , 00000 (phase shift 337.5°), 11111 (phase shift 360°)". All collected data is returned to the universal ATE for calculation, and the actual high-speed serial signal data stream is "1010101010101010 . . . ". Certainly, the phase shift with smaller step can also be controlled each time to perform multiple acquisitions to achieve higher test accuracy.

What is claimed is:

1. A universal semiconductor automatic high-speed serial signal testing method, which is characterized in that comprising: acquiring a high-speed serial signal outputted by a chip to be tested, a control unit outputting a control signal to the chip to be tested, the chip to be tested firstly sending, the high-speed serial signal to an impedance matching unit, passing the high-speed serial signal into a phase shift unit through impedance matching, then by means of the phase shift unit, sequentially transforming, according to a set fixed resolution, the phase of the high-speed serial signal, the magnitude of each offset phase being determined by a phase shift control signal outputted by the control unit and the resolution of the phase shift unit; after passing through the phase shift unit, the high-speed serial signal keeps channel impedance matching by means of the impedance matching unit; the signal entering an acquisition unit, and being acquired under the action of an acquisition control signal sent by the control unit; the control unit performing signal exchange with semiconductor ATE; and the acquisition unit transmitting the acquired signal back to the universal semiconductor ATE for algorithm operation, and then the actual high-speed serial data stream is obtained.

2. The universal semiconductor automatic high-speed serial signal testing method according to claim 1, characterized in that, the phase shift unit is composed of n+1 phasers and corresponding n+1 control bits, the phase shift of the n+1 phasers are $\vartheta*2^i$, i=0, 1, 2, 3, . . . n, $\vartheta*2^n=180°$, the phase shift control signal outputted by the control unit is applied to each control bit, make each control bit control the relay switch to different positions respectively, make the n+1 phasers enter phase shift in different combinations, each high-speed serial signal passing into a phase shift unit through impedance matching, the signal outputted by the phase shift unit is phase shifted relative to the inputted high-speed serial signal.

3. The universal semiconductor automatic high-speed serial signal testing method according to claim 2, characterized in that, the acquisition unit receiving the high-speed serial signal with different phase shift, the acquisition unit acquiring at the acquisition rate of the acquisition unit after each phase shift, which is equivalent to sampling high-speed serial signals at a fixed number of different sampling points.

* * * * *